(12) United States Patent
Youn et al.

(10) Patent No.: US 6,376,292 B1
(45) Date of Patent: Apr. 23, 2002

(54) SELF-ALIGNING PHOTOLITHOGRAPHY AND METHOD OF FABRICATING SEMICONDUCTOR DEVICE USING THE SAME

(75) Inventors: Kang Sik Youn; Hae Wang Lee, both of Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 09/594,021

(22) Filed: Jun. 15, 2000

(30) Foreign Application Priority Data

Jun. 29, 1999 (KR) ............................. 99-25470

(51) Int. Cl.[7] ................. H01L 21/336; H01L 21/8234
(52) U.S. Cl. ................... 438/197; 438/622; 438/314; 438/583; 438/395; 438/158; 430/325; 257/374
(58) Field of Search ................... 430/325, 395, 430/494, 311, 322; 438/622, 314, 583, 395, 158, 197, 420, 220, 527, 585; 257/374

(56) References Cited

U.S. PATENT DOCUMENTS

| | | | | |
|---|---|---|---|---|
| 4,379,833 A | * | 4/1983 | Canavello et al. | .......... 430/325 |
| 5,266,505 A | * | 11/1993 | Ahlgren et al. | |
| 5,661,067 A | * | 8/1997 | Lee et al. | .................. 438/420 |
| 5,801,088 A | * | 9/1998 | Gardner et al. | ............. 438/585 |
| 5,981,150 A | * | 11/1999 | Aoki et al. | .................. 430/322 |
| 6,080,654 A | * | 6/2000 | Manchester | ................. 438/622 |

FOREIGN PATENT DOCUMENTS

JP          402172110 A   *   7/1990   ........... H01B/13/00

* cited by examiner

*Primary Examiner*—Matthew Smith
*Assistant Examiner*—Victor Yevsikov
(74) *Attorney, Agent, or Firm*—Birch, Stewart, Kolasch & Birch, LLP

(57) ABSTRACT

Self-aligning photolithography method and a method of fabricating a semiconductor device using the same, in which the photolithography method is performed using a lower pattern without employing a separate mask. The self-aligning photolithography method includes the steps of forming a lower pattern layer on a semiconductor substrate, depositing a photoresist, and subjecting to exposure without a photomask such that the photoresist aligned with the lower pattern layer is not to be exposed by diffraction of light, and either removing or leaving only the photoresist aligned with the lower pattern layer by development.

12 Claims, 13 Drawing Sheets

\* cleaning and drying

\* soft bake grain boundary short channel gate     long channel gate unstable N- and P-type polysilicon profile insufficient N-, P-type polysilicon doping

SELF-ALIGNING PHOTOLITHOGRAPHY AND METHOD OF FABRICATING SEMICONDUCTOR DEVICE USING THE SAME

BACKGROUND OF THE INVENTION

1. Field of the Invention

The present invention relates to a semiconductor device and, more particularly, to a self-aligning photolithography method and a method of fabricating a semiconductor device using the same, in which a photolithography process is performed using a lower pattern without employing a separate mask.

2. Discussion of Related Art

A photoresist is a compound whose inner structure is changed when it is exposed to an energy such as light or heat. According to this characteristic, the photoresist is selectively exposed to light to form a specific pattern therein, being used in device fabrication processes, for example, etching or ion implantation. The principle factor in forming a fine pattern using photolithography is the wavelength of an exposure radiation source for exposing the photoresist. That is, the diffraction of light around a mask acts as the main limit factor for resolution. Diffraction of exposure radiation changes the size of the photoresist pattern. If diffracted rays of light are in contact with each other, the pattern is not formed.

There is explained below a conventional photolithography process with reference to the attached drawings. FIGS. 1A to 1F are cross-sectional views for explaining a conventional photolithography process using a negative photoresist.

In the conventional photolithography process, first of all, electrical parameters according to a circuit design are converted to physical sizes on a glass substrate using an emulsion, chrome and oxidized steel thin film, to form a photomask having a specific pattern. Thereafter, a pattern transfer process is carried out. That is, as shown in FIG. 1A, a to-be-etched layer 2 on a wafer 1 is cleaned and dried to be in the optimum state without having particles.

Referring to FIG. 1B, a photoresist 3 is coated on to-be-etched layer 2. Then, soft bake is performed in order to facilitate alignment of photomask and improve adhesion between to-be-etched layer 2 and photoresist 3, as shown in FIG. 1C. This soft bake process removes the solvent contained in photoresist 3. Referring to FIG. 1D, a photomask 4 is exactly aligned with wafer 1 and then exposed to ultraviolet rays to form polymerized portion(s). Here, the pattern of the polymerized portion of photoresist 3 varies depending on the type (positive or negative) of the photoresist 3. Specifically, with the positive type photoresist, the light-exposed portion of the photoresist is removed by the subsequent development. On the other hand, the light-exposed portion of the negative photoresist is left during the development.

Referring to FIG. 1E, photoresist 3 having the polymerized portion is developed to remove the portion of the photoresist 3 other than the polymerized portion, thereby forming a photoresist pattern 3a. Thereafter, as shown in FIG. 1F, the exposed portion of to-be-etched layer 2 is selectively etched using photoresist pattern 3a, thereby forming a layer pattern 2a.

There is described below an example of a device fabrication process to which the aforementioned layer patterning in process is applied. FIG. 2 is a cross-sectional view of a "stack via contact" structure of a semiconductor device, which is typically applied to a multi-level metal line. Formation of this stack via contact requires exact alignment between a lower plug 21 and an upper plug 22. The process of forming the stack via contact is as follows. A first interlevel insulating layer 24 is formed on a wafer 23 on which a cell transistor (not shown) including an impurity diffusion region is formed, and selectively removed using a photomask to form a contact hole. Lower plug 21 is formed in the contact hole, and a second interlevel insulating layer 25 is formed on first interlevel insulating layer 24 including lower plug 21. A via contact hole is formed in second interlevel insulating layer 25 using a photomask, being exactly aligned with lower plug 21. The upper plug 22 is formed in the via contact hole. In the formation of the via contact, there is some alignment margin between lower and upper plugs 21 and 22. However, the alignment margin decreases as the device is highly integrated.

Another application of photolithography is a gate patterning process. FIG. 3 is a plan view showing a channeling effect according to gate channel width, and FIGS. 4A to 4D are cross-sectional views for explaining a gate fabrication process for restricting the channeling effect. As shown in FIG. 3, in a long channel gate, even if channeling effect occurs, it does not affect device characteristics. However, in a short channel gate, the channeling effect deteriorates the device characteristics.

The gate channeling occurs when impurities are implanted into portions of a substrate on both sides of the gate using a gate pattern, and a short channel is formed which allows the impurities to enter under the gate, thereby forming a channel without applying electrical signals. This channeling effect occurs if the channel width is defined in the size below the grain boundary size of a material layer for forming the gate, for example, a polysilicon layer. To restrict this channeling effect, there has been proposed a patterning and ion implanting method which is discussed below referring to FIGS. 4A–4D.

As shown in FIG. 4A, a gate oxide layer 42, polysilicon layer 43 and gate cap layer 44 are sequentially formed on a semiconductor substrate 41. As shown in FIG. 4B, polysilicon layer 43 and gate cap layer 44 are selectively patterned by photolithography, to form a gate pattern 45. As shown in FIG. 4C, LDD (Lightly Doped Drain) ion implantation is performed. Then, as shown in FIG. 4D, gate sidewall 46 are formed and ion implantation is executed for forming source and drain regions (not shown). Thereafter, gate cap layer 44 is removed from the gate electrode 45 and a silicide layer 47 is formed. With this process, the channeling effect according to ion implantation is restricted.

A conventional process of forming dual gates using photolithography is as follows. FIGS. 5A and 5B are cross-sectional views for showing etch profiles and unstable ion implanted regions. FIG. 5A shows that gate doping is carried out before etching of a gate forming material layer. In this case, the etch profile depends on the type of implanted impurity, n-type or p-type, resulting in unstable gate etching profile after the etch process for forming the gate is performed. FIG. 5B shows LDD ion implantation and source/drain ion implantation performed after gate patterning. In this case, although the etching profiles are stable, gate doping is not sufficiently performed because the ion implantation for forming the source and drain and the gate doping process are simultaneously executed.

There are the following problems associated with the above-described conventional photolithography and process of fabricating a semiconductor device using it. First of all, when the conventional photolithography is applied to the fabrication of stack via contact, which requires alignment of lower and upper layers, the misalignment of photomask occurs to deteriorate device characteristics. Secondly, in the case where a gate is patterned using the conventional photolithography and then ion implantation for forming source and drain regions is performed, if the gate is patterned to have a fine width below the grain boundary of a gate forming material, the channeling effect is inevitably provided. Furthermore, the process for restricting this channeling effect using the cap layer complicates the fabrication process.

Thirdly, when the gate is doped through pre-doping process before gate patterning during the formation of the dual gates, the gate layer is heavily doped and then etched. Thus, the gate etching profile depends on the type of impurity doped into the gate layer, thereby producing unstable etching profile. On the contrary, in the case where the gate forming layer is deposited and etched, and then the ion implantation process for forming the source and drain and the gate doping process are simultaneously performed, the simultaneous doping is carried out with doping condition for the source and drain, which results in insufficient gate doping.

SUMMARY OF THE INVENTION

Accordingly, the present invention is directed to a photolithography and method of fabricating a semiconductor device using the same that substantially obviates one or more of the problems due to limitations and disadvantages of the related art.

An object of the present invention is to provide a self-aligning photolithography method and method of fabricating a semiconductor device using the same, in which photolithography process is performed using a lower pattern without employing a separate mask.

To accomplish the objects of the present invention, there is provided a self-aligning photolithography method including the steps of forming a lower pattern layer on a semiconductor substrate, depositing a photoresist, and subjecting to exposure without a photomask such that the photoresist aligned with the lower pattern layer is not to be exposed by diffraction of light, and either removing or leaving only the photoresist aligned with the lower pattern layer by development.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

Figure 1A:
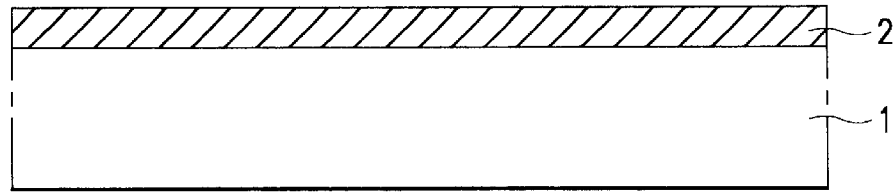
FIGS. 1A to 1F are cross-sectional views for showing a conventional photolithography process using a negative photoresist.
Figure 1B:
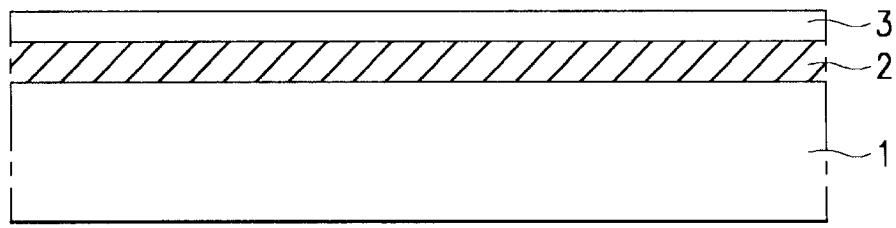
Figure 1C:
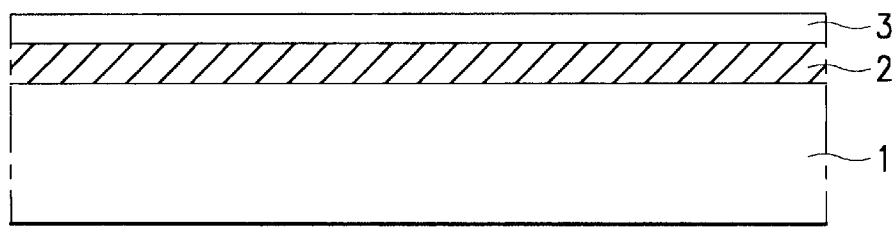
Figure 1D:
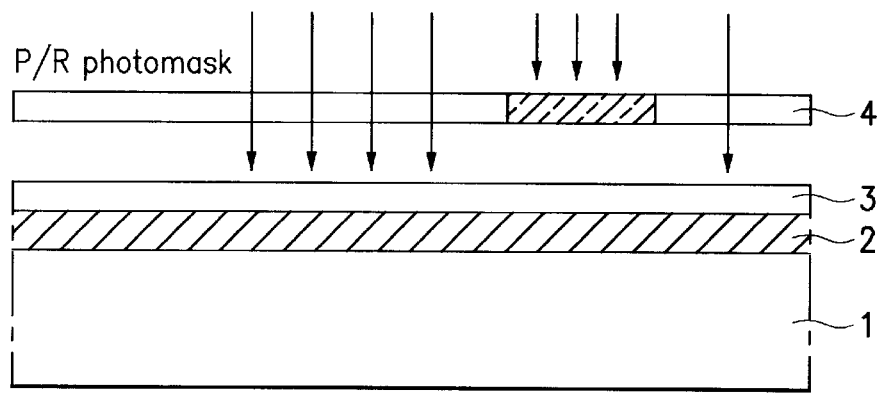
Figure 1E:
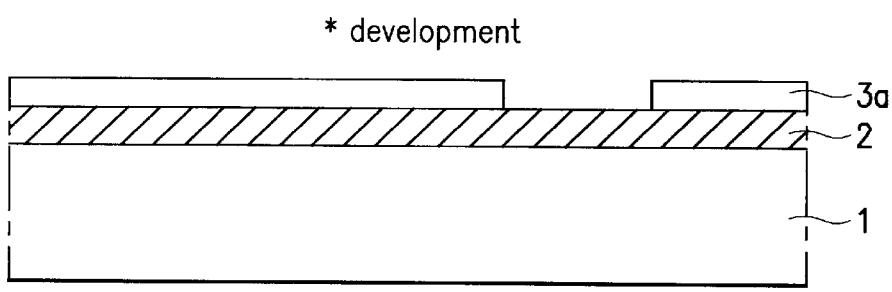
Figure 1F:
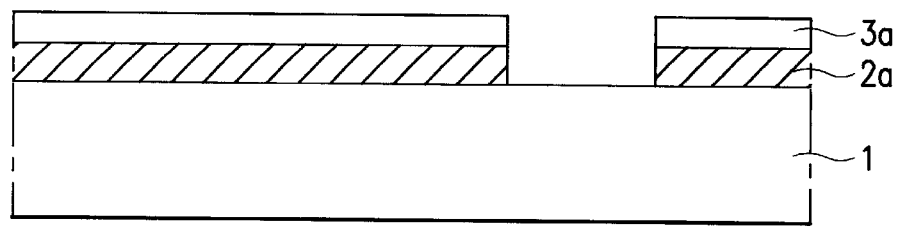
Figure 2:
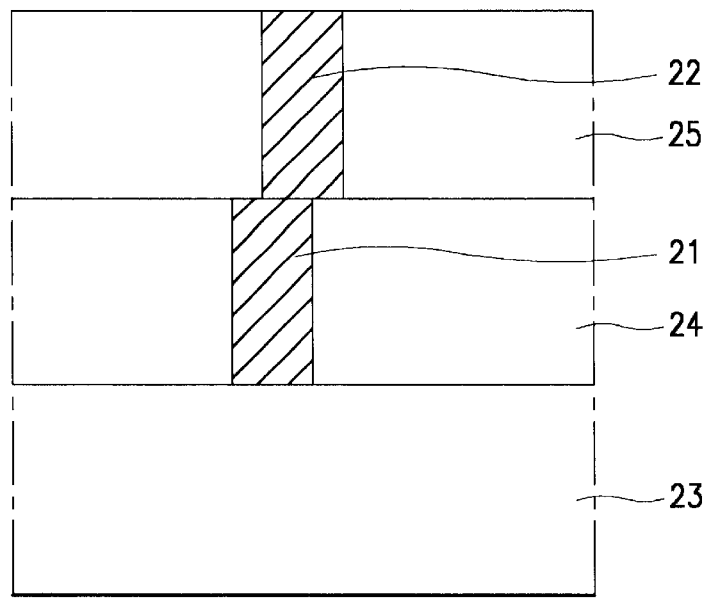
FIG. 2 is a cross-sectional view for showing a stack via contact of a conventional semiconductor device.
Figure 3:
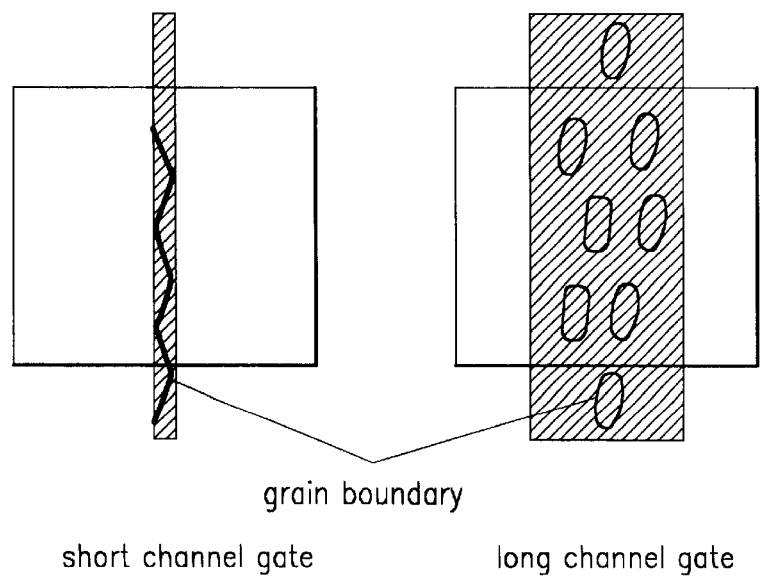
FIG. 3 is a plan view for showing channeling effect according to gate channel width.
Figure 4A:
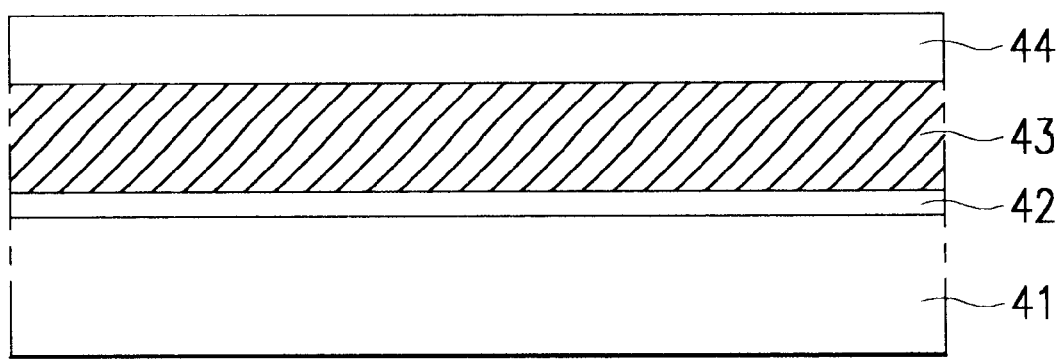
FIGS. 4A to 4D are cross-sectional views for showing a conventional gate forming process for restricting gate channeling.
Figure 4B:
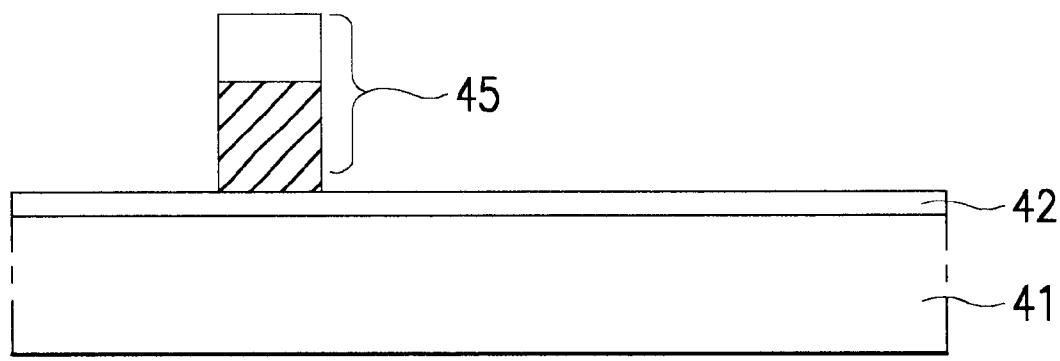
Figure 4C:
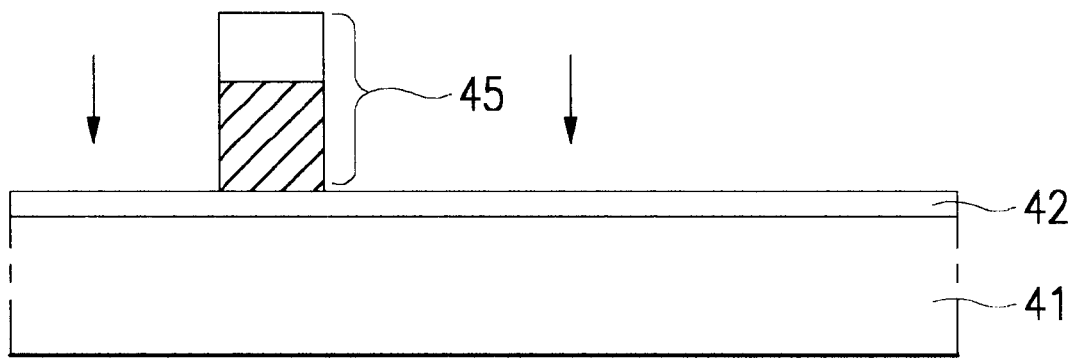
Figure 4D:
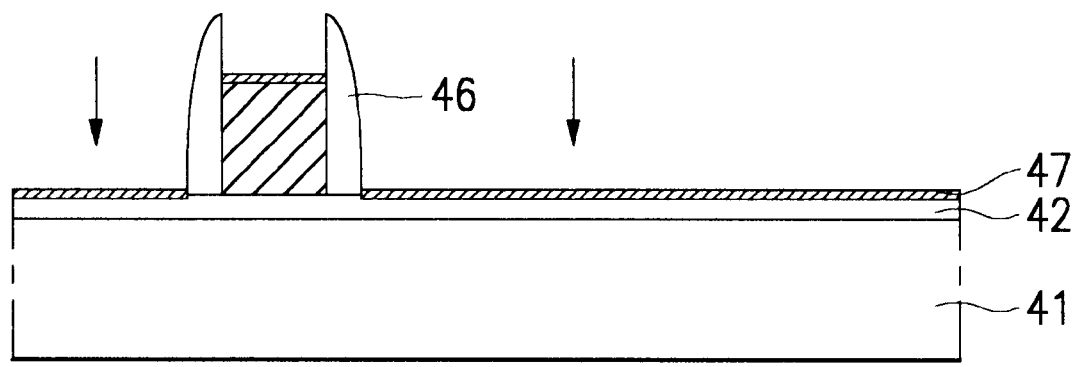
Figure 5A:
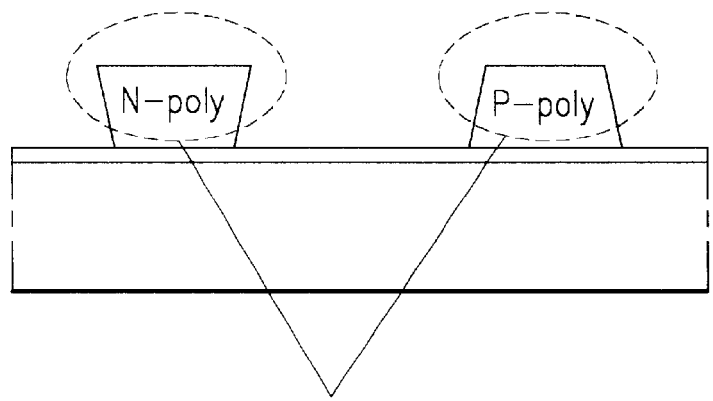
FIGS. 5A and 5B are cross-sectional views for showing etching profiles and unstable ion implanted regions according to formation of conventional dual gates.
Figure 5B:
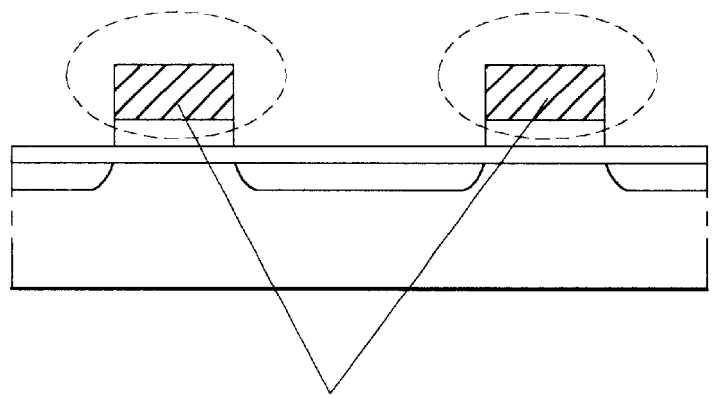
Figure 6:
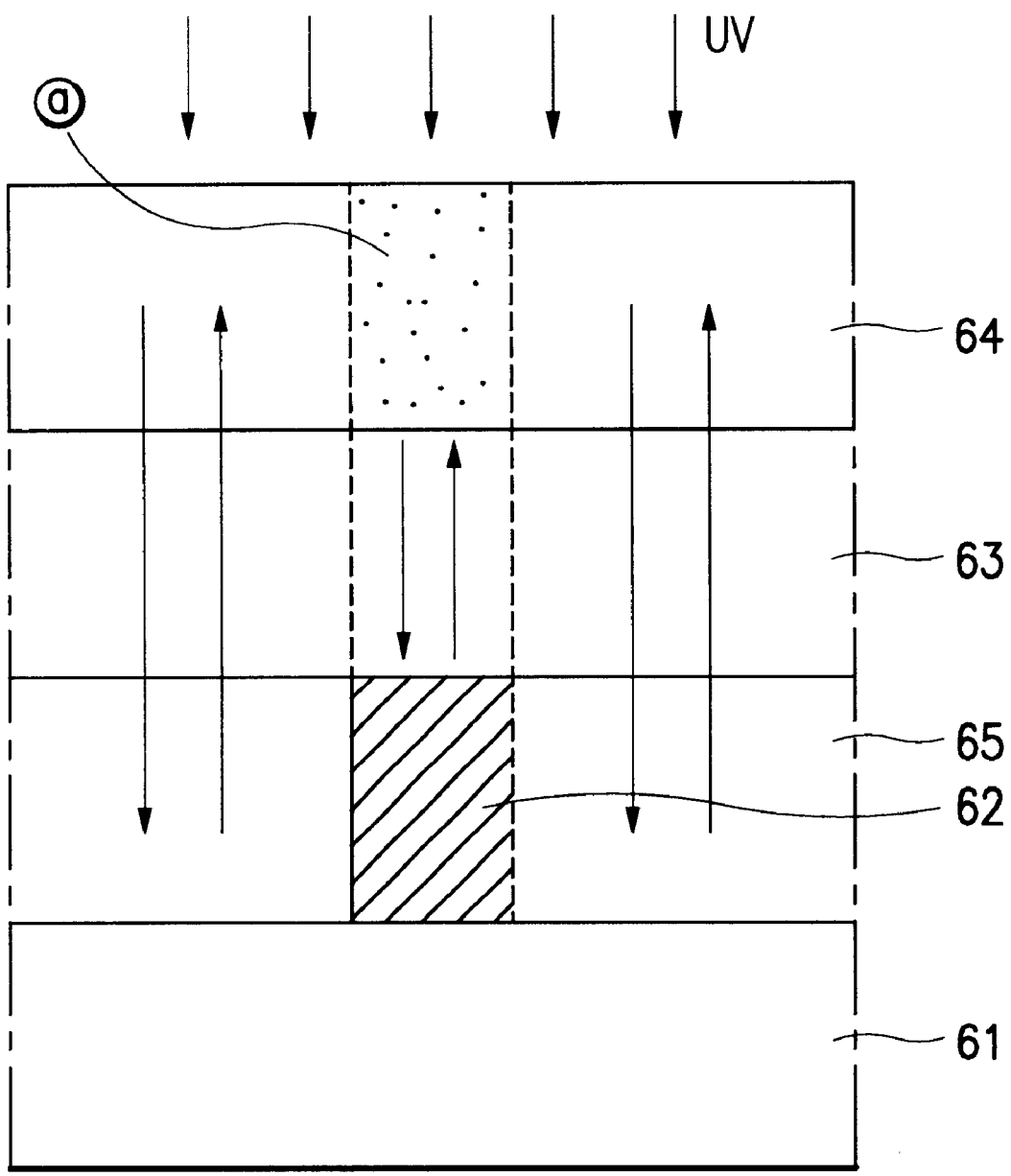
FIG. 6 shows the principle of a self-aligning photolithography method according to one embodiment of the present invention.

FIGS. 8A to 8E are cross-sectional views for showing the processing steps of an ion implantation method for restricting channeling effect using the self-aligning photolithography method of FIG. 6 according to a second embodiment of the present invention; and FIGS. 9A to 9F are cross-sectional views for showing the processing steps of dual gate doping method using the self-aligning photolithography method of FIG. 6 according to a third embodiment of the present invention.

DETAILED DESCRIPTION OF PREFERRED EMBODIMENTS

Reference will now be made in detail to the preferred embodiments of the present invention, examples of which are illustrated in the accompanying drawings.

FIG. 6 shows the principle of a self-aligning photolithography method according to the present invention. The photolithography of the present invention patterns a photoresist using diffraction of a light according to a lower pattern layer without employing a photomask.

As shown in FIG. 6, a lower pattern layer 62 is formed on a semiconductor substrate 61 through an interlevel insulating layer 65, and a to-be-etched layer 63 is formed on the overall surface of the substrate including the lower pattern layer 62 and interlevel insulating layer 65. A negative photoresist 64 is coated on to-be-etched layer 63, and exposed and developed without using a photomask. Here, a portion of photoresist 64, aligned with lower pattern layer 62, is partially exposed due to diffraction of light during exposure, but the other portion of photoresist 64 corresponding to the interlevel insulating layer 65 is completely exposed. Accordingly, only the portion of photoresist 64, aligned with lower pattern layer 62, is removed by the development.

In the self-aligned photoresist patterning process using the lower pattern layer as described above, a positive photoresist as well as a negative photoresist can be used so as to leave the photoresist only on lower pattern layer 62. In FIG. 6, portion (a) denotes the region which is partially exposed due to superposition of wavelength of incident light according to diffraction of light. Depending on whether the photoresist type is negative or positive, the photoresist layer can be left or removed by development. The width of the lower pattern layer 62 is determined to be less than a width that allows the wavelength ($\lambda$) of an incident light impinging on the lower pattern layer 62 to generate a phase difference of ($\frac{1}{2}$)$\lambda$ at edge portions of the lower pattern layer 62. This configuration changes the wavelength ($\lambda$) of the light due to attenuation interference caused by the lower pattern layer 62. In other words, the wavelength of a light reflected by the lower pattern layer 62 differs from the wavelength of a light reflected by the semiconductor substrate 61. This wavelength difference, which causes light diffraction, prevents complete exposure at an upper portion of the lower pattern layer 62.

Figure 7A:
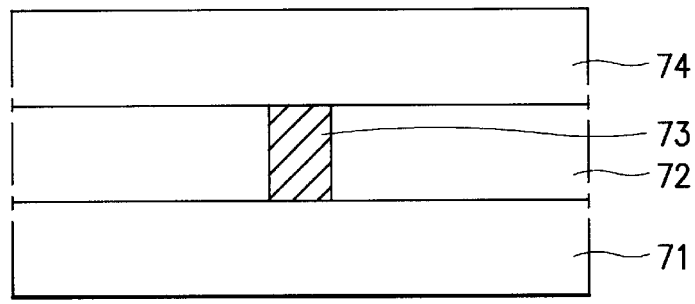
FIGS. 7A to 7F are cross-sectional views for showing the processing steps of a method of forming via contact using the self-aligning photolithography method of FIG. 6 according to a first embodiment of the present invention.
Figure 7B:
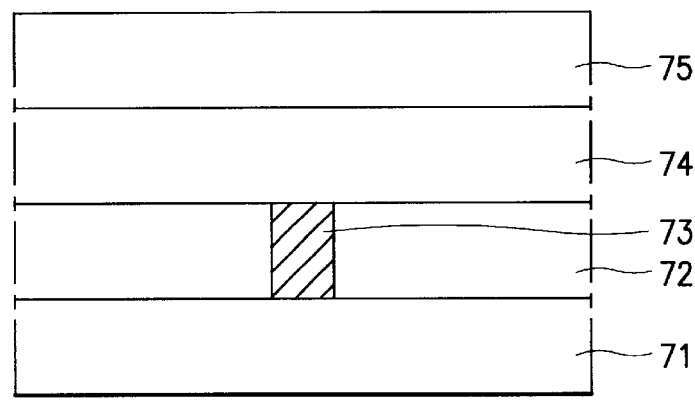

There is explained below an example to which the aforementioned principle is applied. FIGS. 7A to 7F are cross-sectional views showing a method of forming via contact using the self-aligning photolithography method discussed in connection with FIG. 6 according to a first embodiment of the present invention. Referring to FIG. 7A, a to-be-etched layer 74 is formed on an interlevel insulating layer 72 and a lower plug 73 formed therein. All these layers are formed on a semiconductor substrate 71. Referring to FIG. 7B, a negative photoresist is coated on to-be-etched layer 74.

Figure 7C:
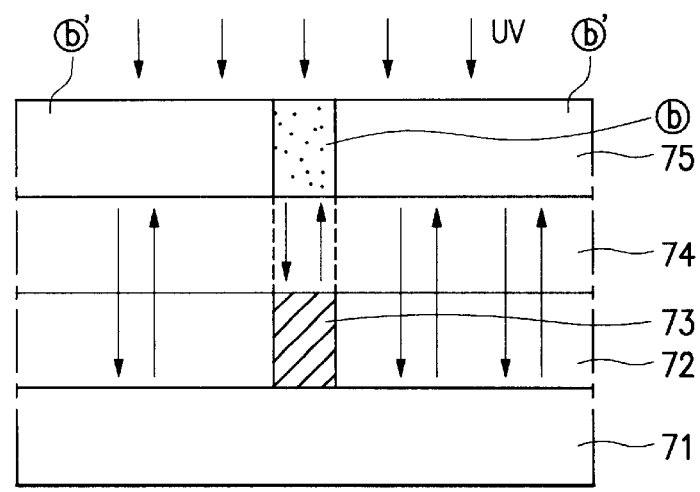
Figure 7D:
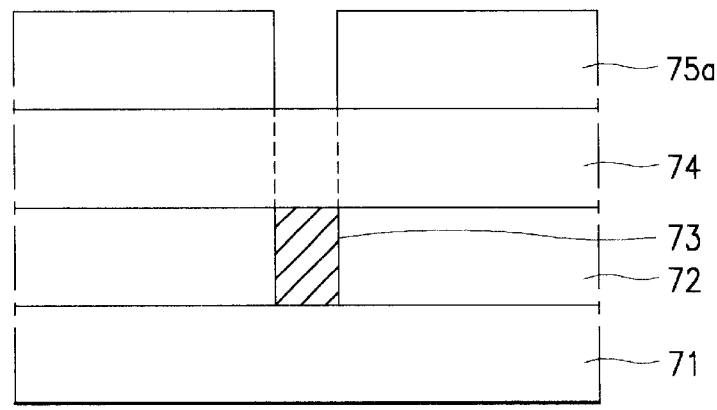

Referring to FIG. 7C, an exposure process is carried out without employing a separate photomask. In this exposure process, a portion (b)' of photoresist 75, placed on the portion other than the lower plug 73, is completely exposed but the other portion (b) of photoresist 75, placed above the lower plug 73, is partially exposed because of wavelength difference from other regions due to lower plug 73. Thereafter, development is performed as shown in FIG. 7D. Here, only the portion (b) of photoresist 75, which is exactly aligned with lower plug 73, is exposed and then removed during the development process, thereby forming a photoresist pattern 75a.

Figure 7E:
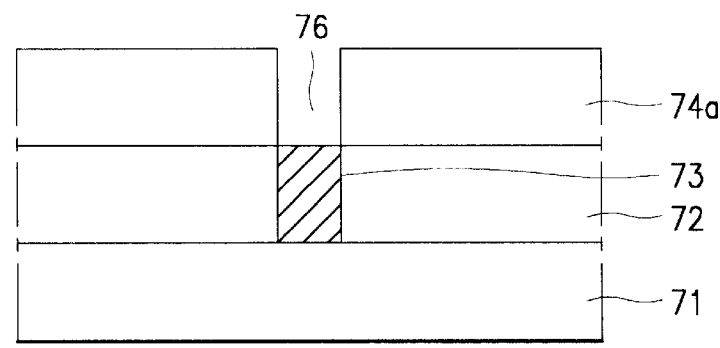
Figure 7F:
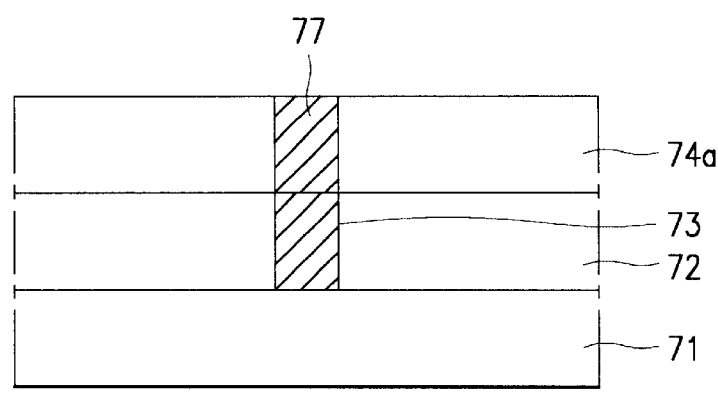

Referring to FIG. 7E, the to-be-etched layer 74 is selectively etched using photoresist pattern 75a as a mask, to form a layer pattern 74a having a via hole 76. Referring to FIG. 7F, a material layer for forming an upper plug is formed to fill via hole 76 and is planarized to form an upper plug 77 which is exactly aligned with lower plug 73. In the first embodiment of the present invention, as described above, the via contact is patterned using the lower pattern layer without employing a separate mask, thereby eliminating or reducing device failures due to misalignment of plugs.

FIGS. 8A to 8E are cross-sectional views for showing the processing steps of an ion implantation method for restricting channeling effect using the self-aligning photolithography method of FIG. 6 according to a second embodiment of the present invention. The second embodiment of the present invention carries out LDD ion implantation or source/drain ion implantation while the height of a short-channel gate electrode is increased using the self-aligning photolithography method of the present invention, to restrict channeling effect. The gate electrode is heightened according to a photoresist pattern layer due to self-alignment.

Figure 8A:
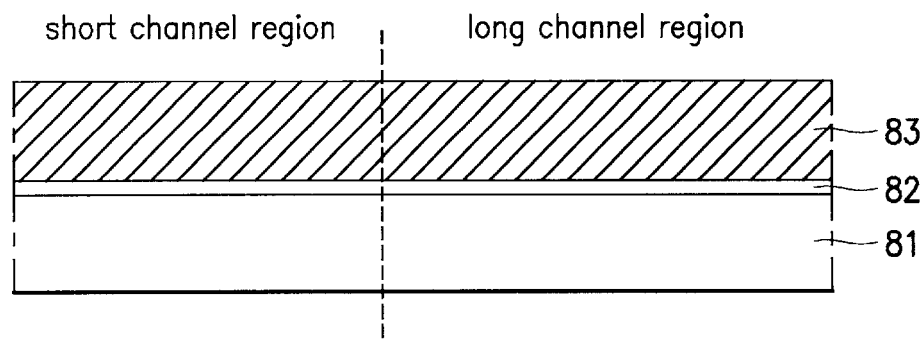
Figure 8B:
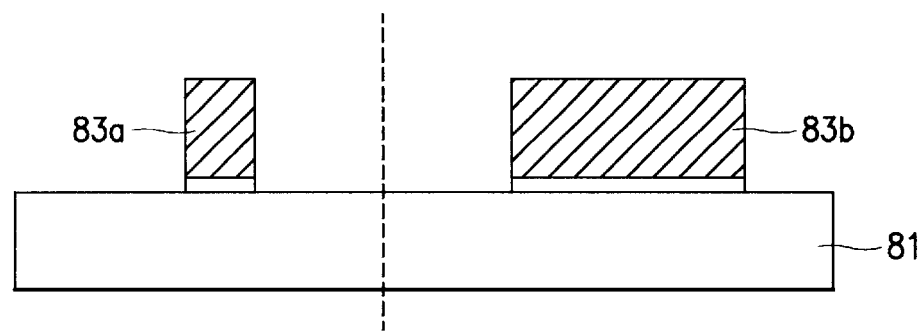
Figure 8C:
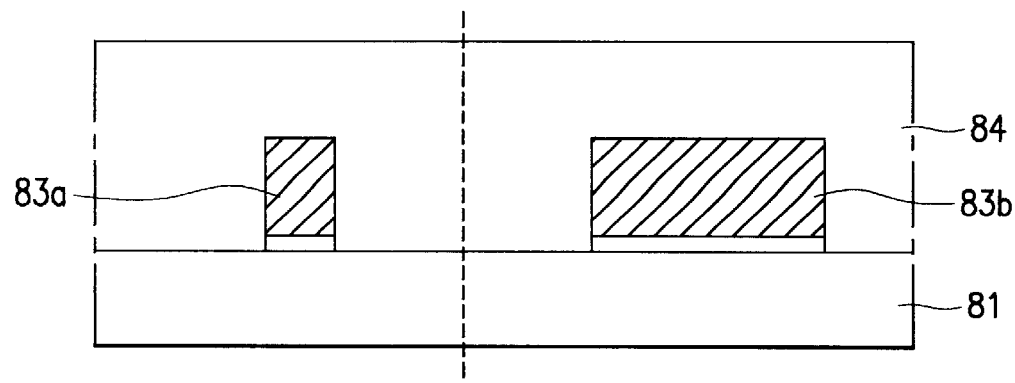

As shown in FIG. 8A, a gate oxide layer 82 and material layer 83 for forming the gate electrode are sequentially formed on a semiconductor substrate 81 including a short channel gate formation region and a long channel gate formation region. As shown in FIG. 8B, material layer 83 for forming the gate electrode is selectively patterned to form gates 83a and 83b having short and long channels, respectively. As shown in FIG. 8C, a photoresist 84 is coated on the overall surface of the substrate.

Figure 8D:
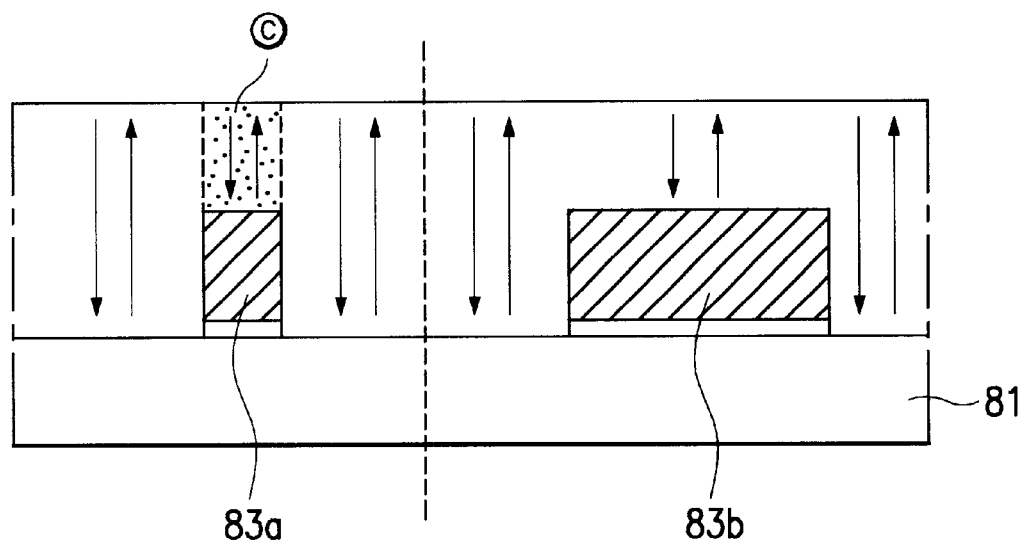
Figure 8E:
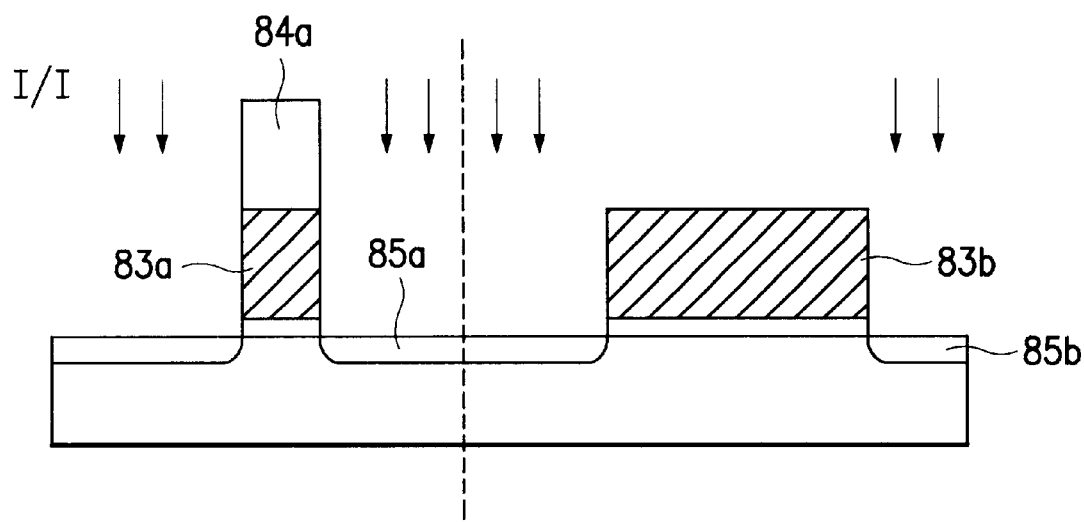

Thereafter, as shown in FIG. 8D, an exposure process is performed without employing a separate mask. In this exposure process, all the portions of photoresist 84 are completely exposed, except for a portion ((c) of FIG. 8D) of photoresist 84 placed directly above the short channel gate electrode 83a. This portion (c) is partially exposed due to the wavelength difference from the other regions according to short channel gate electrode 83a. Then, a development process for removing exposed portions of photoresist 84 is carried out, as shown in FIG. 8E. Here, only the portion of photoresist 84, exactly aligned with short channel gate electrode 83a, is not removed to form a photoresist pattern layer 84a directly above the short channel gate electrode 83a.

Thereafter, when ion implantation is executed for forming source and drain regions 85a and 85b, the total height of short channel gate electrode 83a is increased according to photoresist pattern 84a, which generates no channeling effect. Furthermore, long channel gate electrode 84b is patterned to have the width greater than the grain boundary width of material for forming it, thereby preventing device failure was due to channeling effect.

In the method of fabricating a semiconductor device in accordance with the second embodiment of the present invention, the photoresist pattern is formed only on the short channel gate electrode which is patterned in the size below the grain boundary size using the self-aligning photolithography method without employing a separate photomask, and then ion implantation is performed, thereby effectively restricting channeling.

FIGS. 9A to 9F are cross-sectional views for showing the processing steps of a dual gate doping method using the self-aligning photolithography method according to a third embodiment of the present invention. The third embodiment of the present invention selectively exposes the portion placed on the gate region using the self-aligning photolithography method, to dope the gate therethrough. Here, a negative photoresist is used for doping a short channel gate. The fabrication process according to the $3^{rd}$ embodiment is as follows.

Figure 9A:
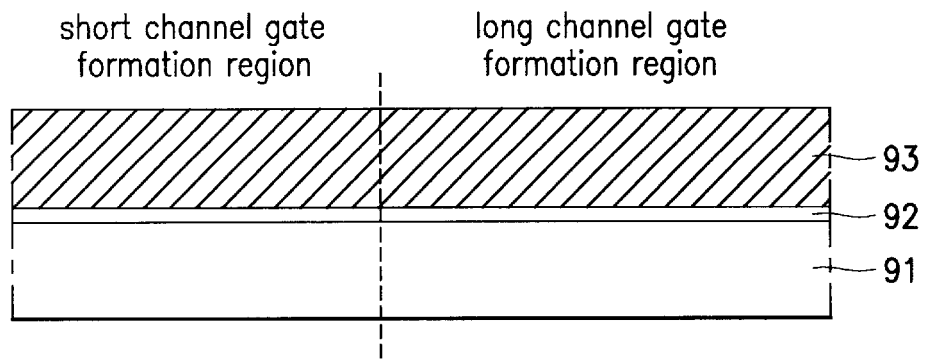
Figure 9B:
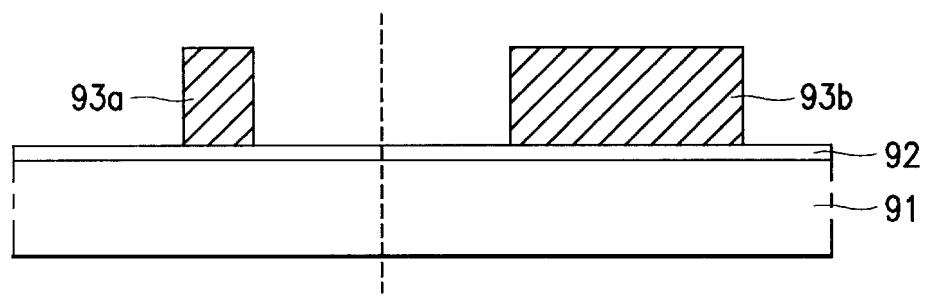
Figure 9C:
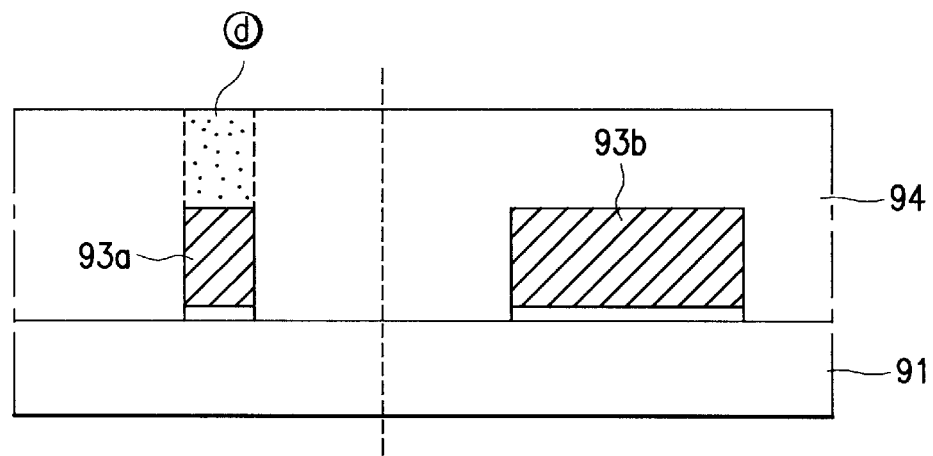

Referring to FIG. 9A, a gate oxide layer 92 and material layer 93 for forming the gate electrode are sequentially formed on a semiconductor substrate 91 including a first and second gate formation regions which require different characteristics from each other. Referring to FIG. 9B, material layer 93 for forming the gate electrode is selectively patterned to form first and second gates 93a and 93b having short and long channels, respectively. Thereafter, referring to FIG. 9C, a negative photoresist 94 is coated on the overall surface of the substrate and exposed without using a separate photomask. With this exposure step, all the portions of photoresist 94 are completely exposed, except for portion (d) of photoresist 94 placed directly above short channel first gate 93a. The portion (d) is not exposed or scarcely exposed due to wavelength difference from the other regions according to first gate electrode 93a.

Figure 9D:
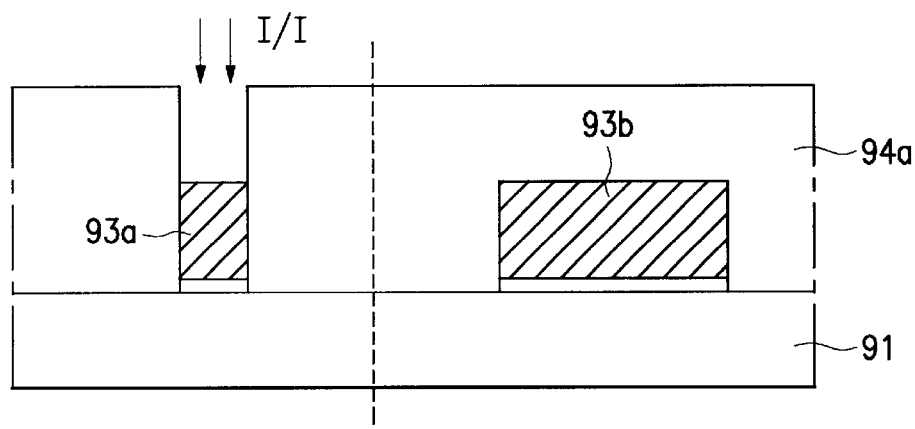
Figure 9E:
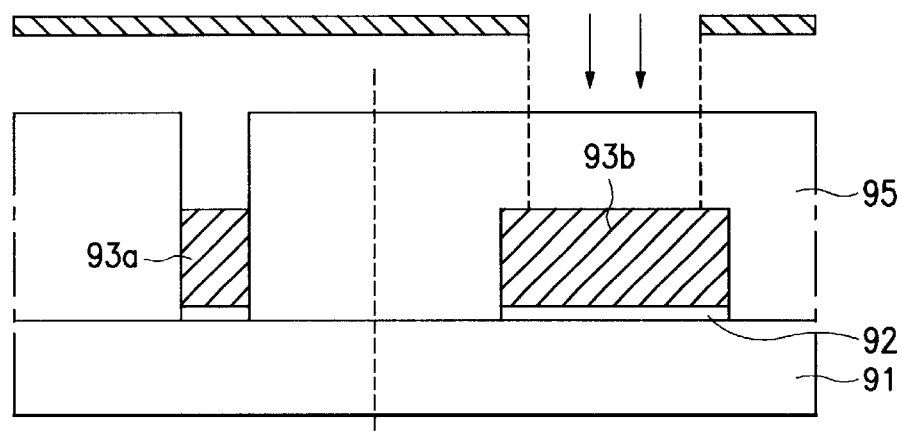

Referring to FIG. 9D, development is carried out. Here, only the portion of photoresist 94, exactly aligned with first gate electrode 93a, is not exposed to allow only the portion (d) of FIG. 9C to be removed during the development, thereby forming a photoresist pattern 94a. By doing so, the short channel gate electrode 93a which is difficult to align is selectively exposed, and the gate electrode 93a is doped therethrough. Referring to FIG. 9E, the entire photoresist pattern 94a is removed, a new photoresist 95 is coated on the overall surface of the substrate again, and a portion of photoresist 95, placed directly above long-channel second gate electrode 93b, is selectively removed using a photomask 97. Here, since long-channel second gate electrode 93b has a wider channel width, the exposure process is executed with sufficient alignment margin.

Figure 9F:
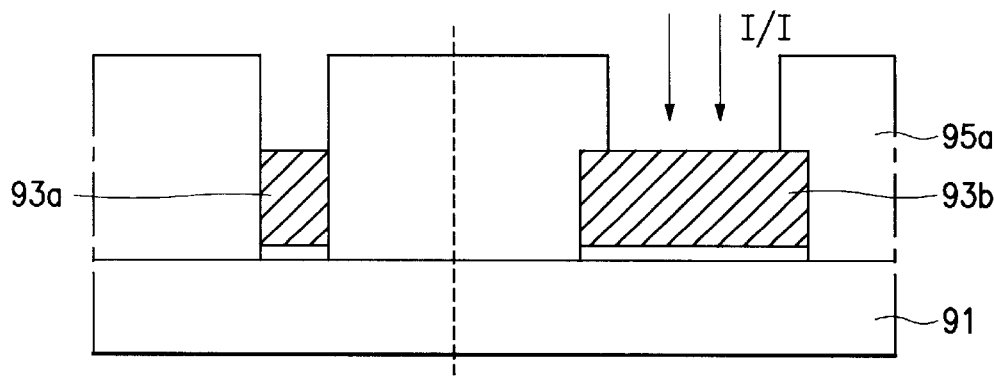

Referring to FIG. 9F, gate doping is carried out using photoresist pattern 95a which selectively exposes a portion of electrode 93b. Then, the process of restricting the channeling effect of the second embodiment of the present invention may be applied following the gate doping process. In the method of fabricating a semiconductor device according to the third embodiment of the present invention, it is possible to secure stability in gate doping and gate etching profile.

The photolithography and method of fabricating a semiconductor device using it according to the present invention has the following advantages. First of all, removal/maintaining of photoresist on a fine pattern which is difficult to align can be accomplished using superposition of wavelengths according to diffraction of light without employing a photomask, thereby the facilitating fabrication process. Secondly, when the stack via contact which requires alignment of lower and upper layers is formed, it is possible to form the upper plug being exactly aligned with the lower plug using light diffraction according to the lower plug without employing a photomask, which prevents device failures.

Thirdly, when the gate is patterned in a fine width which is less than the size of grain boundary of the material for forming it, the photoresist pattern self-aligned with the gate is formed and then source/drain ion implantation is carried out, thereby restricting channeling effect. This simplifies the process by eliminating the need for the cap layer to prevent the channeling effect. Finally, since the gate is doped using self-aligned photoresist pattern, it is able to solve problems of unstable etching profile and insufficient gate doping in the dual gate formation process.

It will be apparent to those skilled in the art that various modifications and variations can be made in the photolithography and method of fabricating a semiconductor device using the same of the present invention without departing from the spirit or scope of the invention. Thus, it is intended that the present invention cover the modifications and variations of this invention provided they come within the scope of the appended claims and their equivalents.

What is claimed is:

1. A self-aligning photolithography method, comprising the steps of:
    forming a lower pattern layer on a semiconductor substrate, said lower pattern layer having predetermined light diffracting characteristics;
    forming an etchable layer in the semiconductor substrate;
    depositing a photoresist over the semiconductor substrate, and subjecting the photoresist to exposure without using a photomask such that a portion of the photoresist aligned with the lower pattern layer is not exposed by diffraction of light caused by the lower pattern layer; and
    either removing or leaving only said portion of the photoresist aligned with the lower pattern layer by a development process.

2. The self-aligning photolithography method as claimed in claim 1, wherein, as one of the predetermined light diffracting characteristics, the lower pattern layer has a width less than a size at which a phase difference of $(½)\lambda$ occurs at edge portions of the lower pattern layer, where $\lambda$ is a wavelength of an incident light.

3. The self-aligning photolithography method as claimed in claim 1, wherein the photoresist is a positive photoresist, and the portion of the photoresist aligned with the lower pattern layer is not exposed so as to leave only the unexposed portion of the photoresist on the lower pattern layer by the development process.

4. The self-aligning photolithography method as claimed in claim 1, wherein the photoresist is a negative photoresist, and the portion of the photoresist aligned with the lower pattern layer is not exposed so as to remove only the unexposed portion of the photoresist on the lower pattern layer by the development process.

5. A method of fabricating a semiconductor device using self-aligning photolithography, comprising the steps of:
    forming a to-be-etched layer on an entire surface of a semiconductor substrate including a lower plug layer;
    coating a negative photoresist on the to-be-etched layer;
    carrying out an exposure process without using a photomask to expose a portion of the photoresist not corresponding to the lower plug layer, and not to expose a portion of the photoresist corresponding to the lower plug layer due to a wavelength difference from other regions caused by the lower plug layer;
    carrying out a development process to remove only the portion of the photoresist corresponding to the lower plug layer and thereby forming a photoresist pattern layer;
    selectively removing the to-be-etched layer using the photoresist pattern layer as a mask to form a via hole in the to-be-etched layer; and
    forming a material layer in the via hole and planarizing the material layer to form an upper plug layer aligned with the lower plug layer.

6. The method as claimed in claim 5, wherein the lower plug layer has a width less than a size at which a phase difference of $(½)\lambda$ occurs at certain portions of the lower plug layer, wherein $\lambda$ is a wavelength of an incident light.

7. A method of fabricating a semiconductor device using self-aligning photolithography, comprising the steps of:
    forming gate electrodes having respectively short and long channels on a semiconductor substrate having regions for forming the gate electrodes with different channel widths;
    coating a positive photoresist on an entire surface of the substrate;
    carrying out an exposure process without using a photomask, such that only a portion of the photoresist on the short channel gate electrode is not exposed due to a wavelength difference from other regions caused by the short channel gate electrode;
    carrying out a development process to leave only the unexposed portion of the photoresist and thereby forming a photoresist pattern layer; and
    executing ion implantation for forming source and drain regions while an entire height of the short channel gate electrode is increased by the photoresist pattern layer.

8. The method as claimed in claim 7, wherein one of the gate electrodes is doped with n-type impurities, and another one of the gate electrodes is doped with P-type impurities.

9. A method of fabricating a semiconductor device using self-aligning photolithography, comprising the steps of:
    forming first and second gate electrodes respectively having short and long channels on a semiconductor substrate, the first and second gate characteristics different from each other;
    coating a negative photoresist on an entire surface of the substrate;
    carrying out an exposure process without using a photomask, such that only a portion of the photoresist on the short-channel first gate electrode is not exposed due to a wavelength difference from other regions caused by the first gate electrode;
    carrying out a development process to remove only the portion of the photoresist aligned with the first gate electrode and thereby forming a photoresist pattern layer; and doping the first gate electrode using the photoresist pattern layer as a mask.

10. The method as claimed in claim 9, further comprising the steps of:

removing the negative photoresist completely after said doping step;

coating a second photoresist on an entire surface of the substrate;

patterning a portion of the second photoresist on the long-channel second gate electrode using a photomask; and doping the second gate electrode using the patterned second photoresist as a mask.

11. The method as claimed in claim 9, wherein either the first gate or the second gate electrode is doped with n-type impurities, and the other one of the first and second gate electrodes is doped with p-type impurities.

12. A self-aligning photolithography method, comprising the steps of:

forming a lower pattern layer on a semiconductor substrate;

forming an etchable layer on the semiconductor substrate;

forming a photoresist on the semiconductor substrate and subjecting the photoresist to exposure without using a photomask such that a portion of the photoresist aligned with the lower pattern layer is not exposed by diffraction of light; and either removing or leaving only the portion of the photoresist aligned with the lower pattern by a development process, wherein the lower pattern layer has a width less than a size at which a phase difference of $(½)\lambda$ occurs at edge portions of the lower pattern layer, wherein $\lambda$ is a wavelength of an incident light.

* * * * *